US009274161B1

(12) United States Patent
Tatcho et al.

(10) Patent No.: US 9,274,161 B1
(45) Date of Patent: Mar. 1, 2016

(54) VOLTAGE PROFILE BASED FAULT LOCATION IDENTIFICATION SYSTEM AND METHOD OF USE

(71) Applicant: The Florida State University Research Foundation, Inc., Tallahassee, FL (US)

(72) Inventors: Passinam Tatcho, Tallahassee, FL (US); Mischa Steurer, Crawfordville, FL (US); Hui Li, Tallahassee, FL (US)

(73) Assignee: The Florida State University Research Foundation, Inc., Tallahassee ( * ) Notice: Subject to any disclaimer, the term of this patent is extended or adjusted under 35 U.S.C. 154(b) by 0 days.

(21) Appl. No.: 14/166,467

(22) Filed: Jan. 28, 2014

Related U.S. Application Data

(60) Provisional application No. 61/757,507, filed on Jan. 28, 2013.

(51) Int. Cl.
*G01R 31/08* (2006.01)
*H02H 3/00* (2006.01)

(52) U.S. Cl.
CPC ...................... *G01R 31/08* (2013.01)

(58) Field of Classification Search
CPC .................................................. G01R 31/08
USPC ...................... 324/522, 523; 361/85
See application file for complete search history.

(56) References Cited

U.S. PATENT DOCUMENTS

| 2010/0102824 | A1* | 4/2010 | Tremblay | G01R 31/088 324/522 |
| 2012/0091817 | A1* | 4/2012 | Seymour et al. | 307/82 |
| 2012/0271470 | A1* | 10/2012 | Flynn et al. | 700/292 |

OTHER PUBLICATIONS

Jamali and Talavat. Accurate Fault Location Method in Distribution Networks Containing Distributed Generations. Iranian Journal of Electrical and Computer Engineering. 2011. vol. 10 (No. 1): 27-33.
Tremblay et al., Accurate Fault-Location Technique Based on Distributed Power-Quality Measurements. C I R E D 19th International Conference on Electricity Distribution. Vienna, May 21-24, 2007: 1-4.

* cited by examiner

*Primary Examiner* — Jermele M Hollington
*Assistant Examiner* — Farhana Hoque
(74) *Attorney, Agent, or Firm* — Smith & Hopen, P.A.; Molly L. Sauter

(57) ABSTRACT

The present invention provides a method to ensure that distributed resources of a power distribution system remain connected to the circuitry of the power distribution system when a fault occurs at a distributed resource node to assist in identifying the location of the fault by continuing to inject current from the distributed resources into the distribution system. The system contains multiple power electronics based converters which convert the local direct current (DC) distributed sources (DRs) to the alternating current (AC) of the grid. The converters also provide the capability of limiting the current in the system when a fault occurs. The converters also protect the power distribution system equipment against high fault currents.

18 Claims, 5 Drawing Sheets

VOLTAGE PROFILE BASED FAULT LOCATION IDENTIFICATION SYSTEM AND METHOD OF USE

CROSS REFERENCE TO RELATED APPLICATIONS

This invention claims priority to U.S. Provisional Patent Application No. 61/757,507 filed on Jan. 28, 2013 and entitled, "Voltage Profile Based Fault Identification".

STATEMENT OF GOVERNMENT INTEREST

This invention was made with Government support under Grant No. EEC0812121 awarded by the National Science Foundation. The Government has certain rights in the invention.

FIELD OF INVENTION

This invention relates to a voltage profile based fault location identification system for use in a power distribution system. The voltage profile based fault location identification system includes power electronic converters and employs a short circuit limiting fault current.

BACKGROUND OF INVENTION

The IEEE interconnection standard recommends that the distributed resources (DRs) of a power distribution system be disconnected from the power distribution system when the voltage level falls below a recommended threshold to ensure that the distributed resources do not inject power onto the main power grid of the power distribution system. The IEEE interconnection standard is additionally based on the fact that as the voltage level of the distribution system drops, the distributed resource's voltage reference from the substation may no longer be available or may no longer be accurate.

Identifying the location of a fault in a traditional power system is a challenging task. Electric power only flows in one direction, i.e. from the substation to the various loads. Therefore, when a severe short circuit fault occurs in a distribution system, there is an associated current rise and accompanying voltage sag near the faulted node which extends to every node that is downstream of the faulted node. The fault protection system of a power distribution system currently known in the art responds to the short circuit fault by isolating the assumed faulted nodes and all the downstream nodes of the actual faulted node.

In a power distribution system containing distributed resources, most fault location technologies known in the art ignore the presence of the distributed resources by assuming either low distributed resource penetration or no power injection from the distributed resources during a fault situation. While there are additional fault location technologies known in the art that do consider the presence of distributed resources, these technologies do not consider a current limited system when a fault situation does occur.

Accordingly, what is needed in the art is a system and method for fault location identification in a power distribution system that addresses the presence of distributed resources and provides a current limited system when a fault occurs.

SUMMARY OF THE INVENTION

The present invention provides a method to ensure that distributed resources remain connected to the circuit to assist in the fault location by continuing to inject current in the distribution system. The system contains a plurality of power electronic based converters which convert local direct current (DC) of the distributed resources (DRs) to the power grid alternating current (AC). These converters also have the ability to limit the current in the system when a fault occurs; hence, protecting the system equipment against high fault currents.

In one embodiment of the present invention, a method of identifying the location of a fault in a power distribution system is provided. In the present invention, the power distribution system includes a plurality of distributed resources, and the method includes, injecting, by one or more of the plurality of distributed resources, a current into the power distribution system, generating a voltage profile resulting from the injection of current by the one or more distributed resources and analyzing the voltage profile to identify the location of the fault in the power distribution system.

In an additional embodiment, the present invention provides a system for locating a fault in a power distribution system. The system includes a power distribution system including a plurality of distributed resources coupled to the power distribution system, one or more of the plurality of distributed resources comprising a controllable voltage source converter configured to inject a current into the power distribution system. The system further includes, a voltage profile generator configured for generating a voltage profile resulting from the injection of current by the one or more distributed resources and an analyzer configured for analyzing the voltage profile to identify the location of the fault in the power distribution system.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Modern power distribution systems include distributed resources that provide local power generation and are connected to the power distribution system. Such local power generation sources include photovoltaic (PV) systems, wind systems and microturbines. The number and diversity of these local power generation sources is rapidly increasing. As the number of local power sources connected to an existing power distribution system rises, the distribution system fault location methods currently known in the art have become increasingly inadequate. Reasons for the increasing inadequacy of the current fault location methods include unreasonable cost of the system, system complexity (mesh-like topology) and bidirectional power flow in the distribution system that is not addressed by the current fault location methodologies.

The fault location identification system of the present invention takes advantage of the existing topology of the power distribution system. The fault location identification includes controllable voltage source converters (VSCs) to assist in the location of the fault and alters the voltage profile of the system in the presence of a fault condition. Utilizing controllable voltage source converters to locate the fault reduces miss-trips of the circuit breakers that result when relying on the measured voltage when there is no electrical supply in a section of the distribution system as a result of a fault. The incorporation of controllable voltage source converters in the fault location identification system will serve to boost the voltage of the distribution system, locate the fault and provide rapid restoration of the distribution system.

Figure 1:
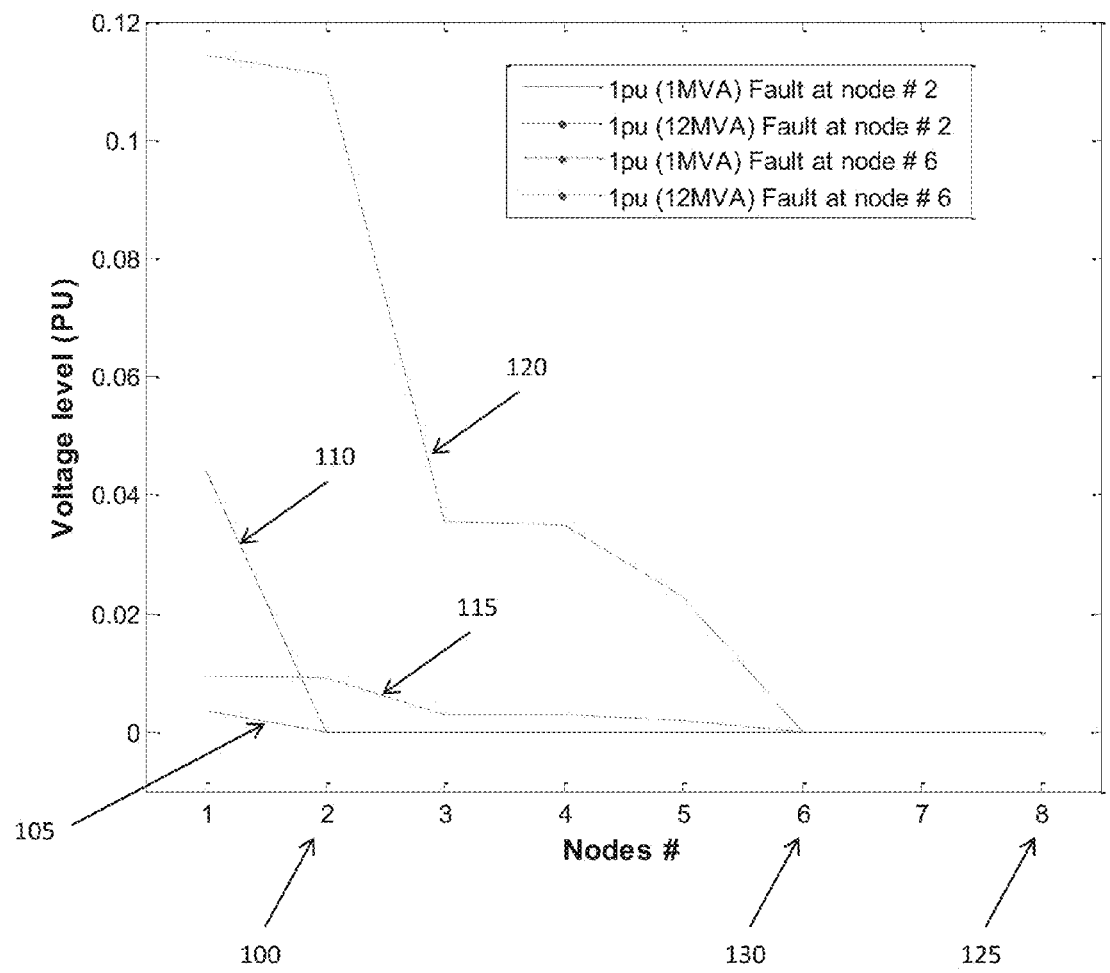
FIG. 1 is voltage profile for a fault at node 2 and node 6 in a traditional distribution system, wherein the system containing no distributed resources or they are disconnected during the fault in accordance with an embodiment of the present invention.

Power distribution system currently known in the art do not employ controllable voltage source converters and the voltage on a feeder associated with the distributed resource is expected to decrease as the distance between the distributed resource and the power distribution system increases. In accordance with the present invention, if the distributed resources in the power distribution system are allowed to inject power, the voltage profile of the system will change as shown in FIG. 1 for the prior art system and FIG. 2 for the fault location identification system of the present invention.

When a severe short circuit fault occurs in a distribution system, there is an associated current rise and accompanying voltage sag near the faulted node which extends to every node that is downstream of the faulted node. The fault protection system of a power distribution system currently known in the art responds to the short circuit fault by isolating the assumed faulted nodes and all the downstream nodes of the actual faulted node. As shown in the graph of FIG. 1, when a fault occurs in a prior art fault location identification system, the voltage profile resulting from the fault will provides very limited information regarding the location of the fault. For example in the prior art system, when a fault occurs at node 2 100, in both the 1MVA 105 and 12MVA 110 cases, the distributed resources at nodes 2 100 through 8 125 will be disconnected from the power distribution system by the fault protection system of the power distribution system. Similarly, a fault at node 6 130 will result in the distributed resources at nodes 6 130 through 8 125 being isolated from the rest of the system.

Figure 2:
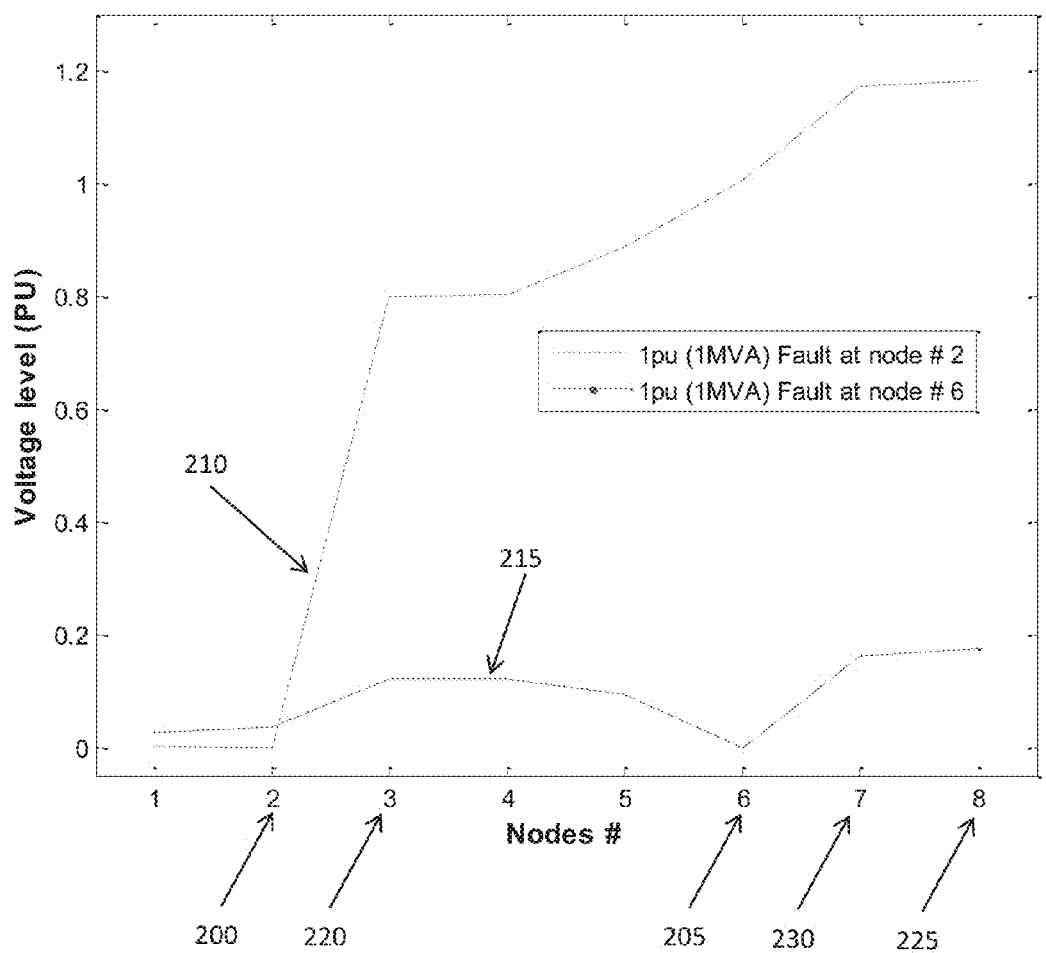
FIG. 2 is voltage profile for a fault at node 2 and node 6 in a distribution system containing distributed resources in accordance with an embodiment of the present invention.

In contrast, as shown in the graph of FIG. 2, the voltage profile resulting from a fault in accordance with the fault location identification system of the present invention identifies the fault at either node 2 200 or node 6 205. For example, when a fault occurs at node 2 200, it is seen that the voltage level 210 drops at node 2 200, but the voltage level at nodes 3 220 through 8 225 is maintained by the use of the controlled voltage source converters at each of the distributed resources associated with each of nodes 3 220 through 8 225. Additionally, when a fault occurs at node 6 205, it is seen that the voltage level 215 drops at node 6 205, but the voltage level at nodes 7 230 through 8 225 is maintained by the use of the controlled voltage source converters at each of the distributed resources associated with each of nodes 7 230 through 8 225. As such, the voltage profile provided by the fault location identification system of the present invention results from the injection of current from all the distributed resource at each of the nodes in the system using the controllable voltage source converters.

Figure 3:
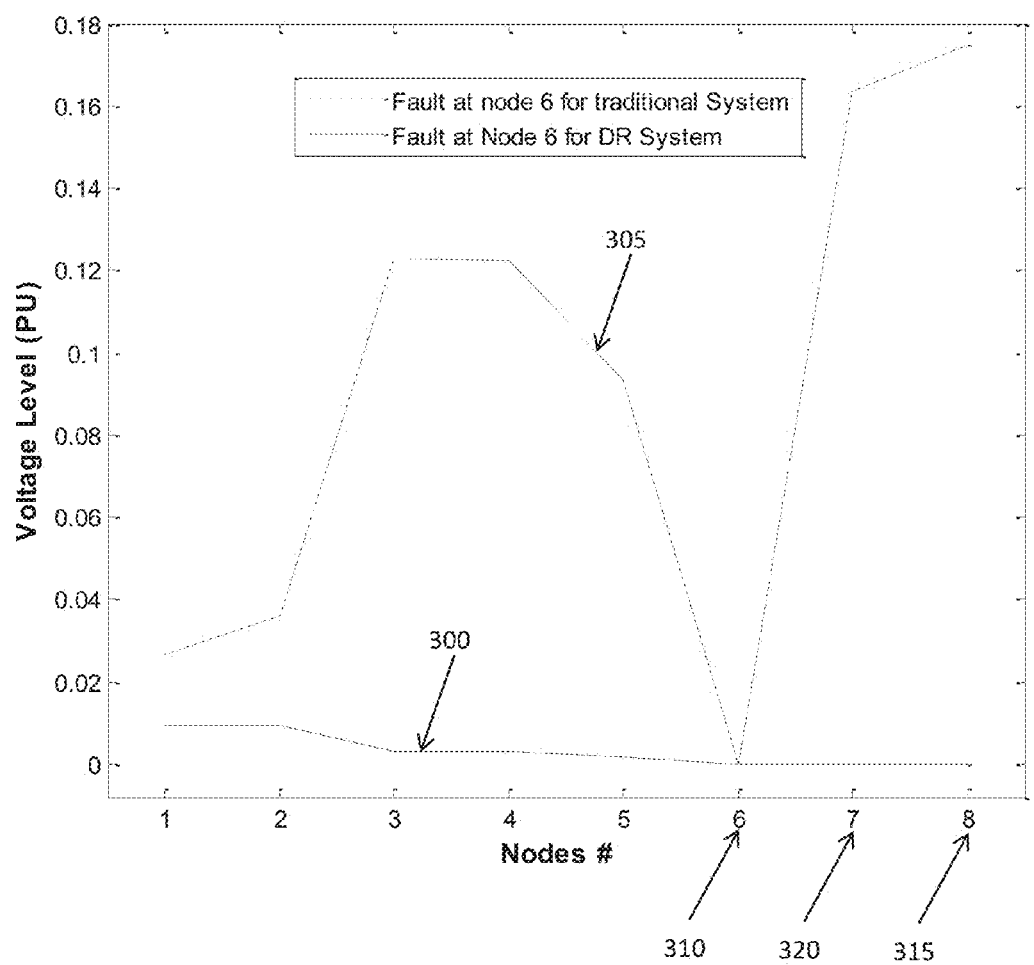
FIG. 3 is voltage profile for a fault at node 6 in a traditional distribution system and one containing distributed resources in accordance with an embodiment of the present invention.

FIG. 3 illustrates the difference in the voltage profiles of a prior art fault location system and the fault location identification system employing multiple distributed resource with controllable voltage source converters achieved by the present invention. As shown, when a fault occurs at node 6 310 in the prior art system, the voltage level drops at nodes 6 310 through 8 315. In contrast, with the fault location identification system of the present invention, when a fault occurs at node 6 310, the voltage level at node 7 320 through 8 315 is maintained by the controllable voltage source converters of the distributed resources at these nodes. As such, the voltage profile for a distributed resource system utilizing the fault location identification system of the present invention clearly indicates the fault at node 6 310 in the system of the present invention, whereas the fault is not clearly identified in the prior art system.

Figure 4:
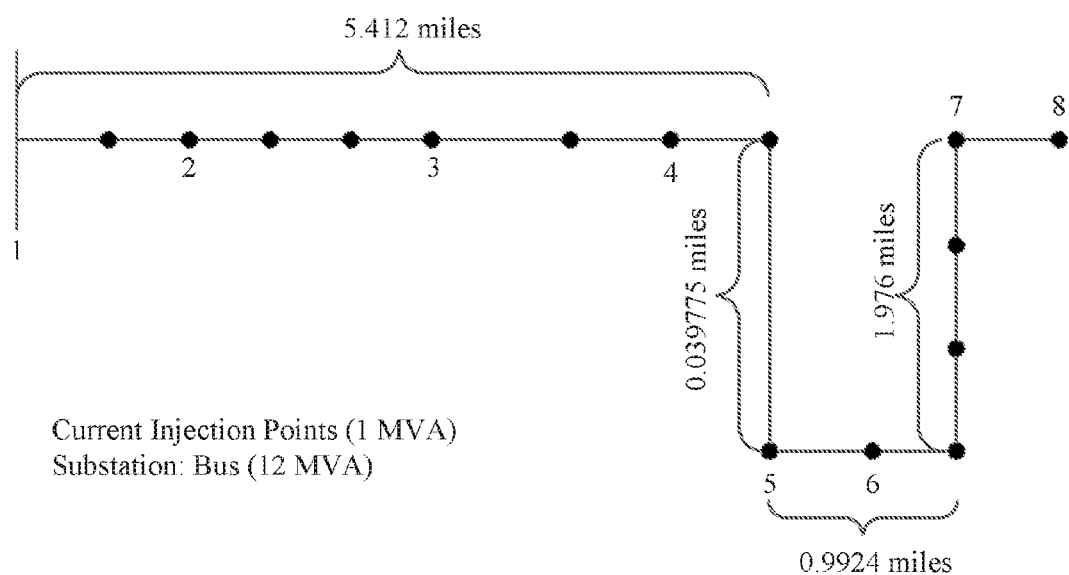
FIG. 4 is a schematic of a test system 11.9 kV (8 nodes) in accordance with an embodiment of the present invention.

FIG. 4 is a schematic illustrating an exemplary embodiment of the present invention that was used to generate the graphs shown in FIGS. 1-3. The physical distance between two adjacent distributed resource nodes will also determine if the faulty node can be located accurately. To get an accurate voltage profile for a power distribution system, it is necessary to measure the voltage at multiple nodes in the system. However, making measurements at the nodes is difficult in the prior art systems because there are limited nodes at which a voltage measurement can be performed. In contrast, in the fault location identification system of the present invention which includes a plurality of distributed resources and a controllable voltage source converter associated with each of the distributed resources, each controllable voltage source converters can serve as a measurement unit at which voltage measurement can be performed and used to generate an accurate voltage profile. As shown in FIG. 4, each of the nodes 1-8 are positioned at varying distances from the distribution grid. It is known that the voltage level naturally decreases the farther the node is away from the distribution grid. In the present invention, the controllable voltage source converters at each of the nodes are used to inject current into the power distribution system thereby providing the system with a means for measuring the voltage level at each of the nodes. Knowing the distances between the nodes with improve the accuracy of the fault location identification system of the present invention.

The voltage profile of the power distribution system changes when a fault occurs in the system and the location of the observed voltage drop in the voltage profile is closely related to the location of the fault. Furthermore, most distributed resources provide DC voltage. Therefore, in a DC system, controllable voltage source converters can modulate an AC signal on top of the DC signal and that modulated AC signal profile may be used to locate the fault similarly to the AC system.

Figure 5:
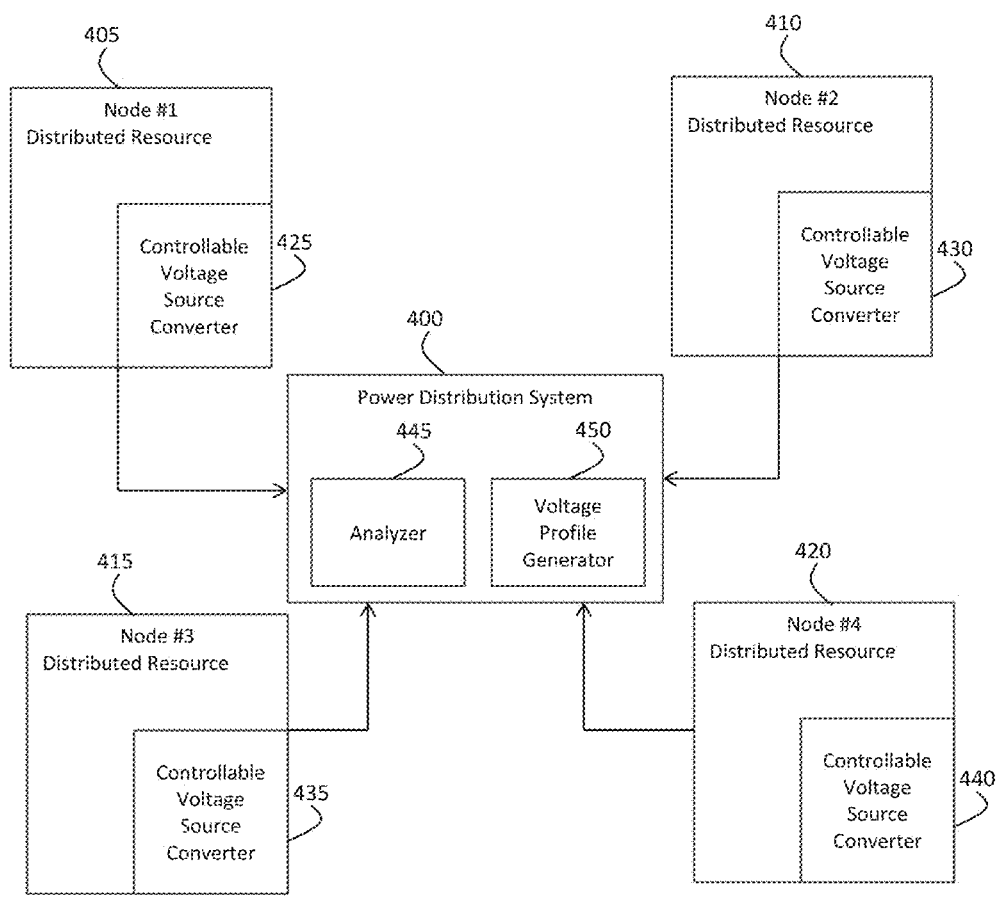
FIG. 5 is a block diagram illustrating a fault location identification system in accordance with an embodiment of the present invention.

In an exemplary embodiment, as illustrated with reference to FIG. 5, the fault location identification system of the present invention includes a power distribution system 400 and a plurality of distributed resources 405, 410, 415, 420 coupled to the power distribution system 400. One or more of the plurality of distributed resources 405, 410, 415, 420 comprising a controllable voltage source converter 425, 430, 435, 440 configured to inject a current into the power distribution system 400. The power distribution system 400 further includes, a voltage profile generator 450 configured for generating a voltage profile resulting from the injection of current by the one or more distributed resources 405, 410, 415, 420 and an analyzer 445 configured for analyzing the voltage profile to identify the location of the fault in the power distribution system 400.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A method of identifying the location of a fault in a power distribution system, the power distribution system comprising one or more feeders and each of the one or more feeders comprising a plurality of distributed resources, the method comprising:
   in response to a fault located at one of the plurality of distributed resources on one of the feeders of the distribution system, injecting, by one or more of the plurality of distributed resources not located at the fault on the feeder, a current into the power distribution system;
   measuring, at each of the one or more distributed resources not located at the fault on the feeder, a voltage resulting from the current injected into the power distribution system;
   generating a voltage profile from the voltage measurements at each of the one or more distributed resources not located at the fault on the feeder; and
   analyzing the voltage profile to identify the location of the fault in the power distribution system.

2. The method of claim 1, wherein in response to a fault located at one of the plurality of distributed resources on one of the feeders of the distribution system, injecting, by one or more of the plurality of distributed resources not located at the fault on the feeder, a current into the power distribution system, further comprises, generating the current to be injected into the power distribution system by a controllable voltage source converter of the distributed resource.

3. The method of claim 2, wherein the one or more distributed resources is a DC voltage distributed resource providing a DC signal.

4. The method of claim 3, further comprising, modulating, by the controllable voltage source converter of the distributed resource, an alternating current (AC) signal on top of the direct current (DC) signal of the distributed resource.

5. The method of claim 1, further comprising maintaining an electrical connection between a first distributed resource of the plurality of distributed resources and the power distribution system when the fault is at the location of the first distributed resource.

6. The method of claim 1, wherein analyzing the voltage profile to identify the location of the fault in the power distribution system further comprises, identifying the voltage drop in the voltage profile to identify the location of the fault in the power distribution system.

7. The method of claim 1, further comprising, isolating the identified fault in the power distribution system.

8. The method of claim 1, wherein the distributed resource is selected from the group consisting of a wind turbine, microturbine, solar panels and cogeneration resources.

9. A system for locating a fault in a power distribution system, the system comprising:
   a power distribution system comprising one or more feeders;
   a plurality of distributed resources located on at least one of the feeders, one or more of the plurality of distributed resources comprising a current injecting circuit configured to inject, in response to a fault located at one of the plurality of distributed resources on the at least one feeder, a current into the power distribution system when the one or more of the plurality of distributed resources is not located at the fault on the at least one feeder;
   a voltage profile generator configured for measuring, at each of the one or more distributed resources not located at the fault on the at least one feeder, a voltage resulting from the current injected into the power distribution system by each of the one or more distributed resources not located at the fault on the at least one feeder and for generating a voltage profile from the voltage measurements; and
   an analyzer configured for analyzing the voltage profile to identify the location of the fault in the power distribution system.

10. The system of claim 9, wherein the current injection circuit is a controllable voltage source converter of the distributed resource.

11. The system of claim 10, wherein the one or more distributed resources is a DC voltage distributed resource providing a DC signal.

12. The system of claim 11, wherein the controllable voltage source converter is configured for modulating an alternating current (AC) signal on top of the direct current (DC) signal of the distributed resource.

13. The system of claim 9, wherein a first distributed resource of the plurality of distributed resources maintains an electrical connection with the power distribution system when the fault is at the location of the first distributed resource.

14. The system of claim 9, wherein the analyzer is configured to analyze the voltage profile and to identify a voltage drop in the voltage profile to identify the location of the fault in the power distribution system.

15. The system of claim 9, further comprising isolation circuitry for isolating the identified fault in the power distribution system.

16. The method of claim 9, wherein the distributed resource is selected from the group consisting of a wind turbine, microturbine, solar panels and cogeneration resources.

17. A system for locating a fault in a power distribution system, the system comprising:
   a power distribution system comprising one or more feeders;
   a plurality of distributed resources located on at least one of the feeders, one or more of the plurality of distributed resources comprising a controllable voltage source converter configured to inject, in response to a fault located at one of the plurality of distributed resources on the at least one feeder, a current into the power distribution system when the one or more distributed resources is located at the fault on the at least one feeder;
   a voltage profile generator configured for measuring, at each of the one or more distributed resources not located at the fault on the at least one feeder, a voltage resulting from the current injected into the power distribution system by each of the one or more distributed resources not located at the fault on the at least one feeder and for generating a voltage profile from the voltage measurements; and an analyzer configured for analyzing the voltage profile to identify the location of the fault in the power distribution system.

18. The system of claim 17, wherein the one or more distributed resources is a direct current (DC) resource generating a DC signal and the controllable voltage source converter is configured for modulating an alternating current (AC) signal on top of the direct current (DC) signal of the distributed resource.

* * * * *